United States Patent
Ichiki

(10) Patent No.: US 9,891,777 B2
(45) Date of Patent: Feb. 13, 2018

(54) METHOD FOR MANUFACTURING TOUCH-PANEL CONDUCTIVE SHEET, AND TOUCH-PANEL CONDUCTIVE SHEET

(71) Applicant: FUJIFILM Corporation, Tokyo (JP)

(72) Inventor: Akira Ichiki, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 140 days.

(21) Appl. No.: 14/883,339

(22) Filed: Oct. 14, 2015

(65) Prior Publication Data
US 2016/0034081 A1 Feb. 4, 2016

Related U.S. Application Data

(63) Continuation of application No. PCT/JP2014/060636, filed on Apr. 14, 2014.

(30) Foreign Application Priority Data

Apr. 15, 2013 (JP) .................. 2013-085304

(51) Int. Cl.
*G06F 3/047* (2006.01)
*G06F 3/044* (2006.01)
(Continued)

(52) U.S. Cl.
CPC ............ *G06F 3/047* (2013.01); *G06F 3/044* (2013.01); *H05K 1/0296* (2013.01); *H05K 1/115* (2013.01);
(Continued)

(58) Field of Classification Search
CPC .......... G06F 3/044; G06F 3/041; G06F 3/047; G06F 2203/04103; G06F 2203/04112
See application file for complete search history.

(56) References Cited

U.S. PATENT DOCUMENTS

| 5,844,506 A | 12/1998 | Binstead |
| 2010/0053114 A1* | 3/2010 | Kaigawa ............... G06F 3/044 345/174 |

(Continued)

FOREIGN PATENT DOCUMENTS

| JP | H09-511086 A | 11/1997 |
| JP | 2009-123106 A | 6/2009 |

(Continued)

OTHER PUBLICATIONS

An Office Action "Notice of Reasons for Refusal" issued by the Japanese Patent Office on Jul. 26, 2016, which corresponds to Japanese Patent Application No. 2013-085304 and is related to U.S. Appl. No. 14/883,339; with English language translation.

(Continued)

*Primary Examiner* — Vijay Shankar
(74) *Attorney, Agent, or Firm* — Studebaker & Brackett PC

(57) ABSTRACT

An object of the invention is to provide a method for more easily manufacturing a touch-panel conductive sheet in which end portions of lead-out wires are collected on one surface side of a substrate with high productivity, and a touch-panel conductive sheet. The method for manufacturing a touch-panel conductive sheet of the invention includes: forming, on a rear surface of a substrate, first detection electrodes and rear surface-side wires of which one ends are electrically connected to the first detection electrodes and the other ends have first pad portions, and on a front surface of the substrate, second detection electrodes, second lead-out wires which are electrically connected to the second detection electrodes, and second pad portions which are arranged at positions opposed to the first pad portions via the substrate; forming through holes penetrating the first pad portions, the substrate, and the second pad portions; and producing through wires which electrically connect the first (Continued)

pad portions and the second pad portions by filling the through holes with a conductive material to form first lead-out wires which include the rear surface-side wires and the through wires and are electrically connected to the first detection electrodes.

22 Claims, 6 Drawing Sheets

(51) Int. Cl.
*H05K 1/02* (2006.01)
*H05K 1/11* (2006.01)
*H05K 3/40* (2006.01)
*H05K 3/10* (2006.01)

(52) U.S. Cl.
CPC ......... *H05K 3/4007* (2013.01); *H05K 3/4038* (2013.01); *G06F 2203/04103* (2013.01); *G06F 2203/04112* (2013.01); *H05K 3/106* (2013.01); *H05K 3/4053* (2013.01); *H05K 2201/09563* (2013.01); *H05K 2201/09681* (2013.01); *H05K 2203/125* (2013.01)

(56) References Cited

U.S. PATENT DOCUMENTS

| 2011/0109583 A1* | 5/2011 | Lee | G06F 3/044 |
| | | | 345/174 |
| 2011/0181545 A1* | 7/2011 | Takahashi | G06F 3/041 |
| | | | 345/174 |
| 2012/0073866 A1 | 3/2012 | Hirai et al. | |

FOREIGN PATENT DOCUMENTS

| JP | 2009-294815 A | 12/2009 |
| JP | 2012-073992 A | 4/2012 |

OTHER PUBLICATIONS

The Translation of the International Preliminary Report on Patentability dated Oct. 29, 2015, which corresponds to PCT/JP2014/060636 and is related to U.S. Appl. No. 14/883,339.
International Search Report, PCT/JP2014/060636, dated Jul. 1, 2014.
An Office Action issued by the Chinese Patent Office dated Apr. 20, 2017, which corresponds to Chinese Patent Application No. 201480021441.8 and is related to U.S. Appl. No. 14/883,339; with English language translation.

\* cited by examiner

«METHOD FOR MANUFACTURING TOUCH-PANEL CONDUCTIVE SHEET, AND TOUCH-PANEL CONDUCTIVE SHEET»

CROSS REFERENCE TO RELATED APPLICATIONS

This application is a continuation of PCT International Application No. PCT/JP2014/060636 filed on Apr. 14, 2014, which claims priority under 35 U.S.C. § 119(a) to Japanese Patent Application No. 2013-085304 filed on Apr. 15, 2013. Each of the above applications is hereby expressly incorporated by reference, in its entirety, into the present application.

BACKGROUND OF THE INVENTION

The present invention relates to a method for manufacturing a touch-panel conductive sheet and a touch-panel conductive sheet.

Conductive sheets in which thin conductive wires are formed on a substrate are widely used in transparent electrodes of various electronic devices such as solar cells, inorganic EL elements, and organic EL elements, electromagnetic shields of various display devices, touch panels, transparent planar heating elements, and the like.

Particularly, the ratio of touch panels mounted on cell phones, portable game machines, and the like has increased in recent years, and a demand for conductive sheets for a capacitive touch panel capable of performing multipoint detection has burgeoned.

As an embodiment of a touch-panel conductive sheet, there is an embodiment in which a substrate, detection electrodes for detecting an input position which are provided on the front surface and the rear surface of the substrate, and lead-out wires for applying a voltage to the detection electrodes are provided. A flexible printed wiring board is connected to one end portions of the lead-out wires.

In this embodiment, since the lead-out wires exist on the front surface and the rear surface of the substrate, it is necessary to adhere the flexible printed wiring board to both of the surfaces. However, since there are many adhesion portions, there is a concern that moisture may easily penetrate therethrough and durability may deteriorate.

For example, a measure in which end portions of lead-out wires are collected on one surface side of a substrate so as to be connected to a flexible printed wiring board only on one surface has been considered for the above-described problem as disclosed in JP2009-123106A. More specifically, JP2009-123106A discloses an embodiment in which the end portions of the lead-out wires are drawn to the front surface side via a conductive material filling through holes.

SUMMARY OF THE INVENTION

JP2009-123106A discloses that the detection electrodes (corresponding to first and second electrode patterns in JP2009-123106A) are made of a transparent conductive material containing an organic conductive polymer as a base, and the lead-out wires (corresponding to wiring patterns 16 and 17 in JP2009-123106A) are formed by screen printing using a silver paste or the like. That is, there is a description in which after the production of the detection electrodes, the lead-out wires which are connected to the detection electrodes are formed by screen printing or the like in a separate process.

In such a method, when a silver paste is applied after the production of the detection electrodes, it is necessary to perform positioning (alignment adjustment) for determining a position to which the paste is to be applied again, and there is a concern that productivity may be decreased with an increasing number of processes.

The invention is contrived in view of the circumstances, and an object thereof is to provide a method for more easily manufacturing a touch-panel conductive sheet in which end portions of lead-out wires are collected on one surface side of a substrate with high productivity.

The inventors have conducted an intensive study on the above-described problem, and as a result, have found that the above-described problem can be solved with the following configurations.

(1) A method for manufacturing a touch-panel conductive sheet, including: forming, on a rear surface of a substrate, first detection electrodes and rear surface-side wires of which one ends are electrically connected to the first detection electrodes and the other ends have first pad portions, and on a front surface of the substrate, second detection electrodes, second lead-out wires which are electrically connected to the second detection electrodes, and second pad portions which are arranged at positions opposed to the first pad portions via the substrate; forming through holes penetrating the first pad portions, the substrate, and the second pad portions; and producing through wires which electrically connect the first pad portions and the second pad portions by filling the through holes with a conductive material to form first lead-out wires which include the rear surface-side wires and the through wires and are electrically connected to the first detection electrodes.

(2) A method for manufacturing a touch-panel conductive sheet, including: forming, on a rear surface of a substrate, first detection electrodes and first pad portions which are electrically connected to end portions of the first detection electrodes, and on a front surface of the substrate, second detection electrodes, second lead-out wires which are electrically connected to the second detection electrodes, and front surface-side wires which have second pad portions arranged at positions opposed to the first pad portions via the substrate and wiring portions electrically connected to the second pad portions; forming through holes penetrating the first pad portions, the substrate, and the second pad portions; and producing through wires which electrically connect the first pad portions and the second pad portions by filling the through holes with a conductive material to form first lead-out wires which include the front surface-side wires and the through wires and are electrically connected to the first detection electrodes.

(3) A method for manufacturing a touch-panel conductive sheet, including: forming, on a rear surface of a substrate, first detection electrodes and rear surface-side wires of which one ends are electrically connected to the first detection electrodes and the other ends have first pad portions, and on a front surface of the substrate, second detection electrodes, second lead-out wires which are electrically connected to the second detection electrodes, and front surface-side wires which have second pad portions arranged at positions opposed to the first pad portions via the substrate and wiring portions electrically connected to the second pad portions; forming through holes penetrating the first pad portions, the substrate, and the second pad portions; and producing through wires which electrically connect the first pad portions and the second pad portions by filling the through holes with a conductive material to form first lead-out wires which include the front surface-side wires, the through wires, and the rear surface-side wires and are electrically connected to the first detection electrodes.

(4) The method for manufacturing a touch-panel conductive sheet according to any one of (1) to (3), in which the first detection electrodes, the second detection electrodes, the first lead-out wires, and the second lead-out wires are made of the same metallic material.

(5) A touch-panel conductive sheet including: a substrate; first detection electrodes which are arranged on a rear surface of the substrate; first lead-out wires of which one ends are electrically connected to the first detection electrodes and the other ends are arranged on a front surface of the substrate, and which include through wires penetrating the substrate as a part; second detection electrodes which are arranged on the front surface of the substrate; and second lead-out wires which are electrically connected to the second detection electrodes, in which the first detection electrodes, the second detection electrodes, the first lead-out wires, and the second lead-out wires contain the same metallic material.

According to the invention, it is possible to provide a method for more easily manufacturing a touch-panel conductive sheet in which end portions of lead-out wires are collected on one surface side of a substrate with high productivity.

DETAILED DESCRIPTION OF THE INVENTION

Hereinbelow, preferred embodiments of a method for manufacturing a touch-panel conductive sheet of the invention will be described.

A characteristic point of the manufacturing method of the invention is that detection electrodes and portions (front surface-side wires, rear surface-side wires, first pad portions, second pad portions, and the like to be described later) which form a part of lead-out wires are formed on a front surface of a substrate, and then through wires which penetrate the substrate is provided to draw the lead-out wires from the rear surface side to the front surface side. In the manufacturing method of the invention, first, since the detection electrodes and portions which form a part of the lead-out wires are manufactured on the substrate and the through wires are then manufactured, there is no need to perform positioning when a paste is applied as in JP2009-123106A, and thus a desired conductive sheet can be more easily manufactured.

<First Embodiment>

A first embodiment of the method for manufacturing a touch-panel conductive sheet (hereinafter, may also be simply referred to as a conductive sheet) of the invention includes at least Process A1 of forming detection electrodes, lead-out wires, and the like on a substrate, Process B1 of forming through holes at predetermined positions, and Process C1 of filling the through holes with a conductive material.

Hereinbelow, materials which are used in the respective processes and procedures thereof will be described in detail with reference to the drawings.

<Process A1 (Wiring Forming Process)>

Process A1 is a process of forming, on a rear surface of a substrate, first detection electrodes and rear surface-side wires of which one ends are electrically connected to the first detection electrodes and the other ends have first pad portions; and forming, on a front surface of the substrate, second detection electrodes, second lead-out wires which are electrically connected to the second detection electrodes, and second pad portions which are arranged at positions opposed to the first pad portions via the substrate.

Figure 1:
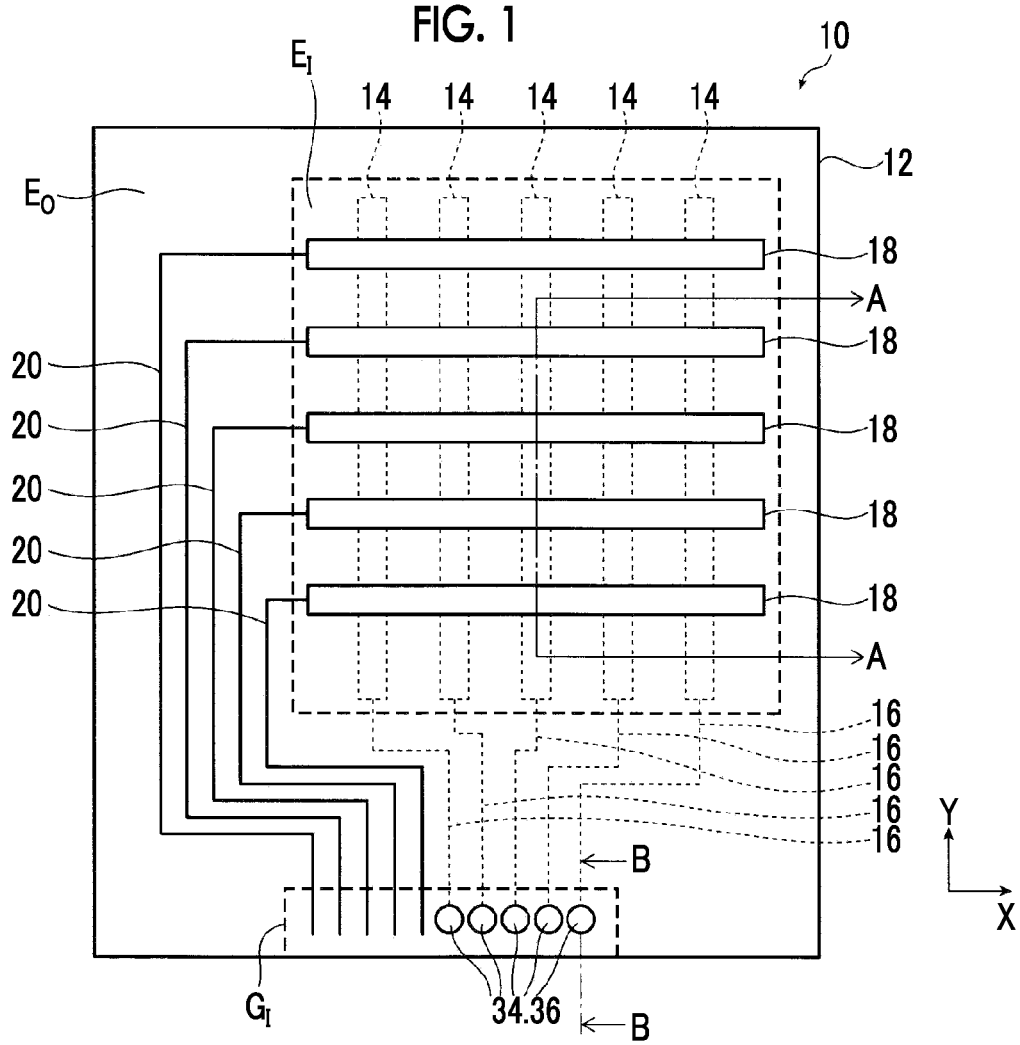
FIG. 1 is a plan view of a substrate with wiring which is formed in Process A1 of a first embodiment of a method for manufacturing a touch-panel conductive sheet of the invention.
Figure 2:
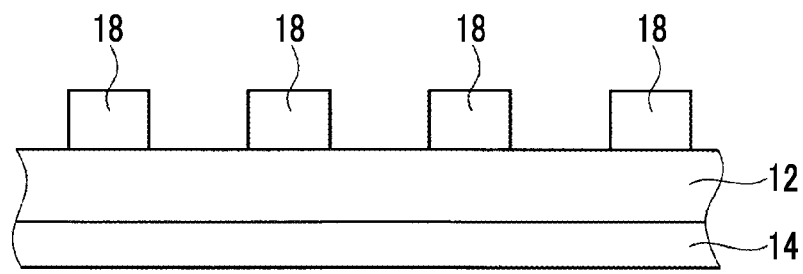
FIG. 2 is a cross-sectional view taken along cutting line A-A shown in FIG. 1.
Figure 3:
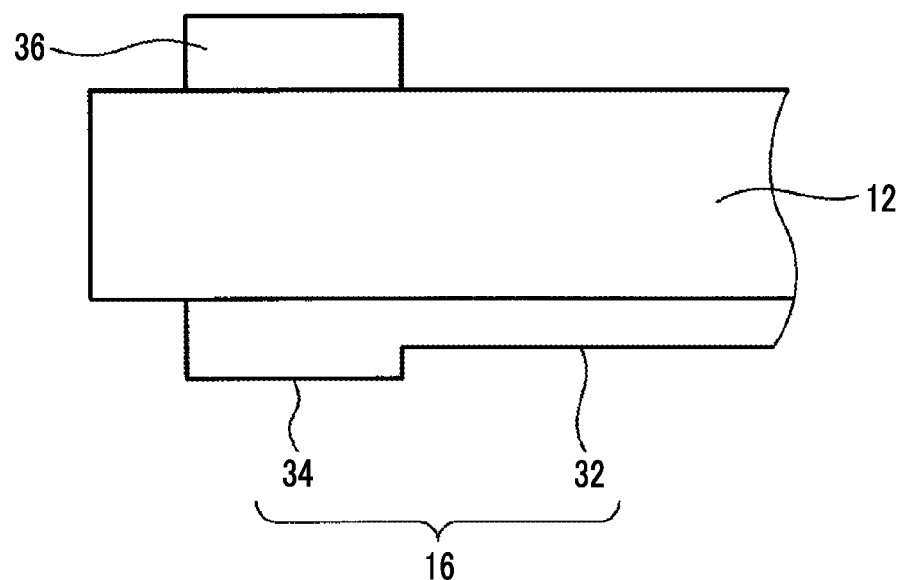
FIG. 3 is a cross-sectional view taken along cutting line B-B shown in FIG. 1.

FIG. 1 illustrates a plan view of a substrate 10 with wiring which is obtained in the above-described Process A1. FIG. 2 is a cross-sectional view taken along cutting line A-A. FIG. 3 is a cross-sectional view taken along cutting line B-B. FIGS. 1 to 3 are schematic illustrations for easy understanding of a layer configuration, and do not precisely illustrate the arrangement of layers.

As illustrated in FIGS. 1 and 2, the substrate 10 with wiring obtained through the above-described Process A1 is provided with a substrate 12, first detection electrodes 14 arranged on a rear surface of the substrate 12, rear surface-side wires 16, second detection electrodes 18 arranged on a front surface of the substrate 12, second lead-out wires 20, and second pad portions 36. On the substrate 12, an input region $E_I$ in which an input operation can be performed by a user when the touch-panel conductive sheet of the invention is incorporated in a touch panel, and an outside region $E_O$ which is positioned outside of the input region $E_I$ are shown. The first detection electrodes 14 and the second detection electrodes 18 are arranged in the input region $E_I$, and first lead-out wires and second lead-out wires to be described later are arranged in the outside region $E_O$.

Hereinbelow, first, constituent members of the substrate 10 with wiring will be described in detail, and then a method for forming the substrate 10 with wiring will be described in detail.

The substrate 12 is a member acting to support the first detection electrodes 14 and the second detection electrodes 18 in the input region $E_I$, and to support the first lead-out wires and the second lead-out wires in the outside region $E_O$.

The substrate 12 preferably and appropriately transmits light. Specifically, the total light transmittance of the substrate 12 is preferably 85% to 100%.

The substrate 12 preferably has insulating properties. That is, the substrate 12 is a substrate (insulating substrate) for ensuring the insulating properties between the first detection electrodes 14 and the second detection electrodes 18.

The substrate 12 is preferably a transparent substrate. Specific examples thereof include insulating resin substrates, ceramic substrates, and glass substrates. Among these, insulating resin substrates are preferred due to having excellent toughness.

Specific examples of the materials of the insulating resin substrates include polyethylene terephthalate resins, polyether sulfone resins, polyacrylic resins, polyurethane resins, polyester resins, polycarbonate resins, polysulfone resins, polyamide resins, polyarylate resins, polyolefin resins, cellulose resins, polyvinyl chloride, and cycloolefin resins. Among these, polyethylene terephthalate resins, cycloolefin resins, polycarbonate resins, and triacetylcellulose resins are preferred due to having excellent transparency.

In FIG. 1, the substrate 12 is a single layer, but may consist of two or more layers.

The thickness of the substrate 12 (when the substrate 12 consists of two or more layers, total thickness thereof) is not particularly limited. However, the thickness is preferably 5 μm to 350 μm, and more preferably 30 μm to 150 μm. When the thickness is within the above range, desired visible light transmittance is obtained and handling is easy.

In FIG. 1, the shape of the substrate 12 when viewed from the top is substantially a rectangular shape, but is not limited thereto. For example, the substrate 12 may have a circular shape or a polygonal shape.

The first detection electrodes 14 and the second detection electrodes 18 constitute a portion (sensing portion) functioning as a sensing electrode which senses a change in capacitance in a touch panel including the conductive sheet of the invention. That is, when a fingertip touches the touch panel, the mutual capacitance between the first detection electrodes 14 and the second detection electrodes 18 changes, and based on the changed amount, an IC circuit calculates the position of the fingertip.

The first detection electrodes 14 act to detect an input position of a user's finger approaching the input region $E_I$ in a Y direction, and have a function of generating capacitance between the electrodes and the finger. The first detection electrodes 14 are electrodes which extend in a first direction (Y direction) and are arranged with predetermined intervals therebetween in a second direction (X direction) perpendicular to the first direction, and include a predetermined pattern as described below.

The second detection electrodes 18 act to detect an input position of a user's finger approaching the input region $E_I$ in the X direction, and have a function of generating capacitance between the electrodes and the finger. The second detection electrodes 18 are electrodes which extend in the second direction (X direction) and are arranged with predetermined intervals therebetween in the first direction (Y direction), and include a predetermined pattern as described below. In FIG. 1, five first detection electrodes 14 and five second detection electrodes 18 are provided. However, the number of the detection electrodes is not particularly limited and is preferably more than one.

Figure 4:
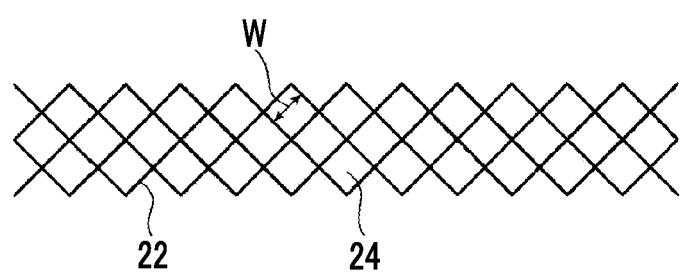
FIG. 4 is an enlarged plan view of a first detection electrode.

In FIG. 1, the first detection electrodes 14 and the second detection electrodes 18 are formed of thin conductive wires. FIG. 4 illustrates an enlarged plan view of a part of a first detection electrode 14. As illustrated in FIG. 4, the first detection electrode 14 is formed of thin conductive wires 22 and includes a plurality of lattices 24 formed by the crossing thin conductive wires 22. As in the case of the first detection electrode 14, the second detection electrode 18 also includes a plurality of lattices 24 formed by crossing thin conductive wires 22.

Examples of the conductive material contained in the thin conductive wires 22 include metals such as gold (Au), silver (Au), copper (Cu), and aluminum (Al) and alloys thereof, and metal oxides such as ITO, tin oxide, zinc oxide, cadmium oxide, gallium oxide, and titanium oxide. Among these, silver is preferred due to imparting excellent conductive properties to the thin conductive wires 22.

The thin conductive wires 22 preferably contain a binder from the viewpoint of adhesion between the thin conductive wires 22 and the substrate 12.

The binder is preferably a water-soluble polymer from the viewpoint of having more excellent adhesion between the thin conductive wires 22 and the substrate 12. Examples of the types of the binder include polysaccharides such as gelatin, carrageenan, polyvinyl alcohol (PVA), polyvinylpyrrolidone (PVP), and starch, cellulose and derivatives thereof, polyethylene oxide, polysaccharide, polyvinyl amine, chitosan, polylysine, polyacrylic acid, polyalginic acid, polyhyaluronic acid, carboxycellulose, gum arabic, and sodium alginate. Among these, gelatin is preferred since the adhesion between the thin conductive wires 22 and the substrate 12 is further improved.

Herein, as gelatin, acid-treated gelatin may be used other than lime-treated gelatin. Moreover, it is possible to use a hydrolysate of gelatin, an enzymatic decomposition product of gelatin, and gelatin modified with an amino group or a carboxyl group (phthalated gelatin or acetylated gelatin).

The volume ratio between the metal and the binder (volume of metal/volume of binder) in the thin conductive wires 22 is preferably 1.0 or greater, and more preferably 1.5 or greater. When the volume ratio between the metal and the binder is 1.0 or greater, the conductive properties of the thin conductive wires 22 can be further improved. The upper limit of the volume ratio is not particularly limited. However, from the viewpoint of productivity, the upper limit is preferably 4.0 or less, and more preferably 2.5 or less.

The volume ratio between the metal and the binder can be calculated from the densities of the metal and the binder contained in the thin conductive wires 22. For example, when the metal is silver and the binder is gelatin, the volume ratio is calculated under the conditions in which the density of silver is 10.5 $g/cm^3$ and the density of gelatin is 1.34 $g/cm^3$.

As a preferred embodiment of the thin conductive wires 22, there is an embodiment in which metallic silver, gelatin, and a polymer different from gelatin are contained.

The polymer different from gelatin (hereinafter, may also be simply referred to as a polymer) is preferably a polymer containing no protein.

More specifically, examples thereof include at least one resin selected from the group consisting of acrylic resins, styrene resins, vinyl resins, polyolefin resins, polyester resins, polyurethane resins, polyamide resins, polycarbonate resins, polydiene resins, epoxy resins, silicone resins, cellulose resins, and chitosan resins, and copolymers formed of monomers of these resins. Among these, a polymer which is not degraded by proteolytic enzyme is preferred, and acrylic resins, styrene resins, polyester resins, and the like are exemplified.

In the polymer, a group (reactive group) reactive with a cross-linking group in a crosslinking agent to be described later may be contained.

Among the polymers, a polymer (copolymer) expressed by the following Formula (1) is exemplified as a preferred embodiment of the polymer in view of further preventing moisture penetration.

-(A)x-(B)y-(C)z-(D)w-   Formula (1)

In Formula (1), A, B, C, and D indicate the following repeating units, respectively.

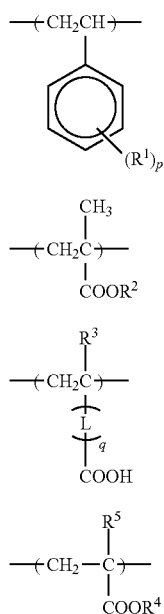

$R^1$ indicates a methyl group or a halogen atom, and preferably indicates a methyl group, a chlorine atom, or a bromine atom. p indicates an integer of 0 to 2, preferably 0 or 1, and more preferably 0.

$R^2$ indicates a methyl group or an ethyl group, and preferably a methyl group.

$R^3$ indicates a hydrogen atom or a methyl group, and preferably indicates a hydrogen atom. L indicates a divalent linking group, and preferably a group expressed by the following Formula (2).

—(CO—$X^1$)r-$X^2$—   Formula (2)

In the formula, $X^1$ indicates an oxygen atom or —$NR^{30}$—. Here, $R^{30}$ indicates a hydrogen atom, an alkyl group, an aryl group, or an acyl group, and each may have a substituent group (for example, a halogen atom, a nitro group, a hydroxyl group, or the like). $R^{30}$ is preferably a hydrogen atom, an alkyl group having 1 to 10 carbon atoms (for example, a methyl group, an ethyl group, a n-butyl group, a n-octyl group, or the like), or an acyl group (for example, an acetyl group, a benzoyl group, or the like). $X^1$ is particularly preferably an oxygen atom or —NH—.

$X^2$ indicates an alkylene group, an arylene group, an alkylene-arylene group, an arylene-alkylene group, or an alkylene-arylene-alkylene group, and in these groups, —O—, —S—, —OCO—, —CO—, —COO—, —NH—, —$SO_2$—, —$N(R^{31})$—, —$N(R^{31})SO_2$—, and the like may be inserted. Here, $R^{31}$ indicates a linear or branched alkyl group having 1 to 6 carbon atoms, and examples thereof include a methyl group, an ethyl group, and an isopropyl group. Preferred examples of $X^2$ include a dimethylene group, a trimethylene group, a tetramethylene group, a o-phenylene group, a m-phenylene group, a p-phenylene group, —$CH_2CH_2OCOCH_2CH_2$—, and —$CH_2CH_2OCO(C_6H_4)$—.

r indicates 0 or 1.

q indicates 0 or 1, and preferably 0.

$R^4$ indicates an alkyl group, an alkenyl group, or an alkynyl group having 5 to 80 carbon atoms, preferably an alkyl group having 5 to 50 carbon atoms, more preferably an alkyl group having 5 to 30 carbon atoms, and even more preferably an alkyl group having 5 to 20 carbon atoms.

$R^5$ indicates a hydrogen atom, a methyl group, an ethyl group, a halogen atom, or —$CH_2COOR^6$, preferably a hydrogen atom, a methyl group, a halogen atom, or —$CH_2COOR^6$, more preferably a hydrogen atom, a methyl group, or —$CH_2COOR^6$, and particularly preferably a hydrogen atom.

$R^6$ indicates a hydrogen atom or an alkyl group having 1 to 80 carbon atoms, and may be the same as or different from $R^4$. The number of carbon atoms of $R^6$ is preferably 1 to 70, and more preferably 1 to 60.

In Formula (1), x, y, z, and w indicate molar ratios of the respective repeating units.

x is 3 mol % to 60 mol %, preferably 3 mol % to 50 mol %, and more preferably 3 mol % to 40 mol %.

y is 30 mol % to 96 mol %, preferably 35 mol % to 95 mol %, and particularly preferably 40 mol % to 90 mol %.

In addition, when z is too small, affinity with a hydrophilic protective colloid such as gelatin is reduced, and thus the probability of aggregation of a matting agent, peeling, and failure is increased. When z is too large, the matting agent of the invention is dissolved in an alkaline treatment liquid for a photosensitive material. Therefore, z is 0.5 mol % to 25 mol %, preferably 0.5 mol % to 20 mol %, and particularly preferably 1 mol % to 20 mol %.

w is 0.5 mol % to 40 mol %, and preferably 0.5 mol % to 30 mol %.

Particularly preferably, x is 3 mol % to 40 mol %, y is 40 mol % to 90 mol %, z is 0.5 mol % to 20 mol %, and w is 0.5 mol % to 10 mol % in Formula (1).

A polymer expressed by the following Formula (2) is preferred as the polymer expressed by Formula (1).

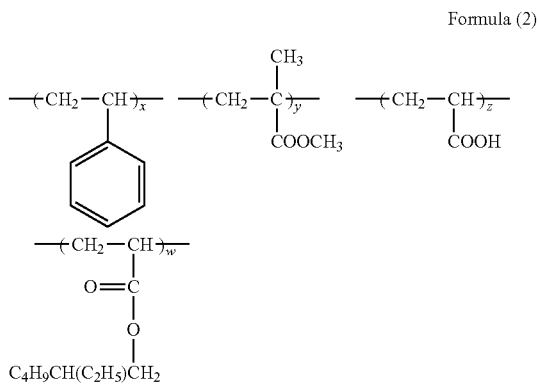

Formula (2)

In Formula (2), x, y, z and w are as defined above.

The polymer expressed by Formula (1) may include a repeating unit other than the units expressed by Formulae (A), (B), (C), and (D). Examples of the monomer for forming other repeating units include acrylic esters, methacrylic esters, vinyl esters, olefins, crotonic esters, itaconic diesters, maleic diesters, fumaric diesters, acrylamides, unsaturated carboxylic acids, allylic compounds, vinyl ethers, vinyl ketones, vinyl heterocyclic compounds, glycidyl esters, and unsaturated nitriles. These monomers are also described in Paragraphs [0010] to [0022] of JP3754745B.

Acrylic esters and methacrylic esters are preferred, and hydroxyalkyl methacrylate such as hydroxyethyl methacrylate or hydroxyalkyl acrylate is more preferred from the viewpoint of hydrophobicity. The polymer expressed by Formula (1) preferably includes a repeating unit expressed by the following Formula (E) in addition to the units expressed by the above Formulae (A), (B), (C), and (D).

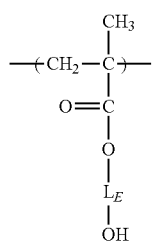

E

In the above formula, $L_E$ indicates an alkylene group, preferably an alkylene group having 1 to 10 carbon atoms, more preferably an alkylene group having 2 to 6 carbon atoms, and even more preferably an alkylene group having 2 to 4 carbon atoms.

A polymer expressed by the following Formula (3) is particularly preferred as the polymer expressed by Formula (1).

Formula (3)

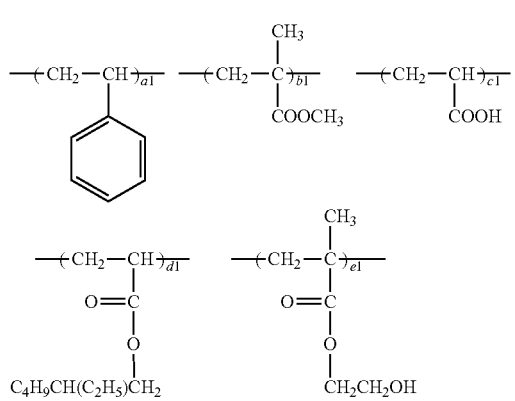

In the above formula, a1, b1, c1, d1, and e1 indicate molar ratios of the respective monomer units. a1 indicates 3 to 60 (mol %), b1 indicates 30 to 95 (mol %), c1 indicates 0.5 to 25 (mol %), d1 indicates 0.5 to 40 (mol %), and e1 indicates 1 to 10 (mol %).

A preferred range of a1 is the same as the preferred range of x, a preferred range of b1 is the same as the preferred range of y, a preferred range of c1 is the same as the preferred range of z, and a preferred range of d1 is the same as the preferred range of w.

e1 is 1 mol % to 10 mol %, preferably 2 mol % to 9 mol %, and more preferably 2 mol % to 8 mol %.

Specific examples of the polymer expressed by Formula (1) will be shown below, but are not limited thereto.

(P-1)

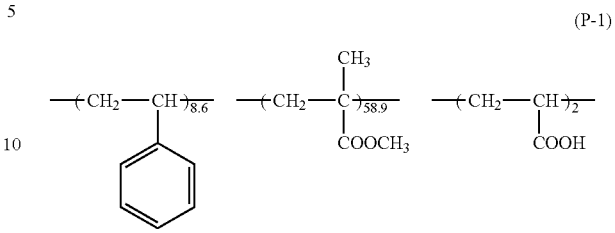

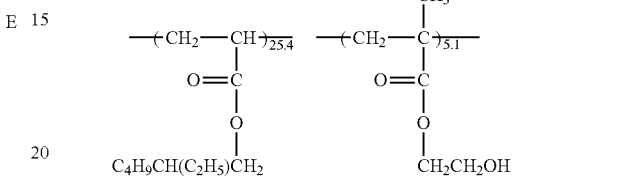

(P-2)

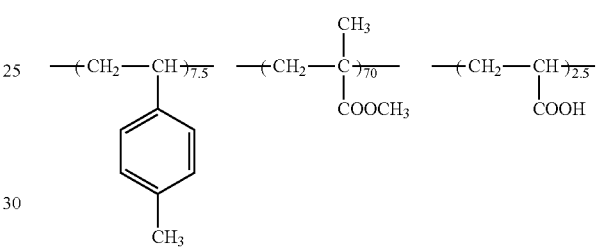

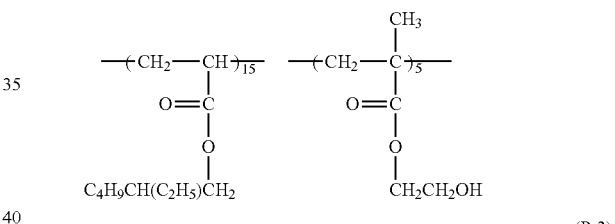

(P-3)

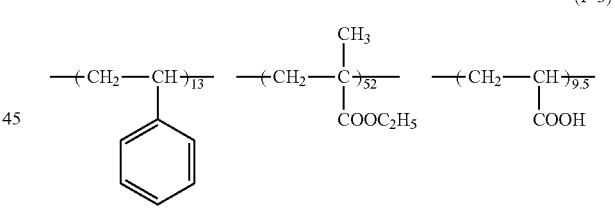

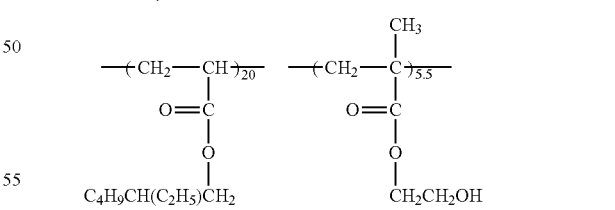

(P-4)

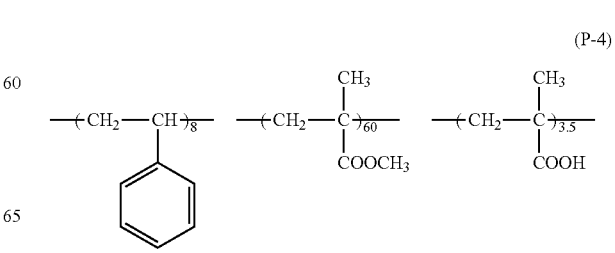

-continued

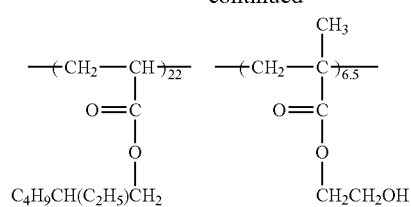
(P-5)

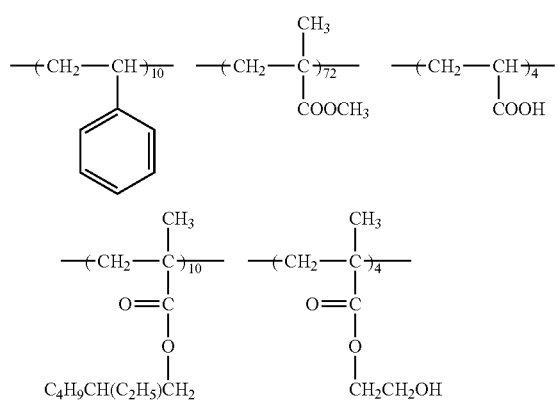
(P-6)

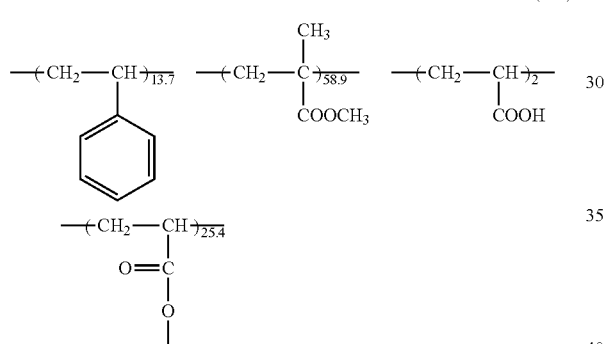
(P-7)

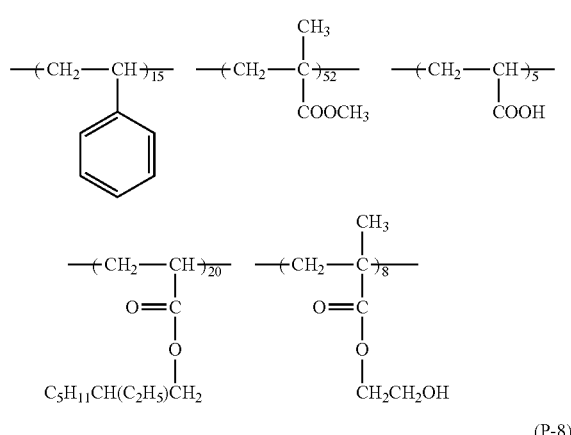
(P-8)

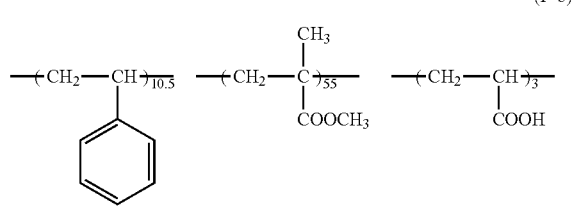

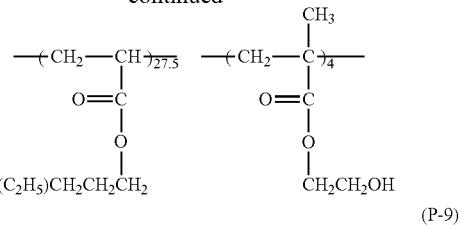
(P-9)

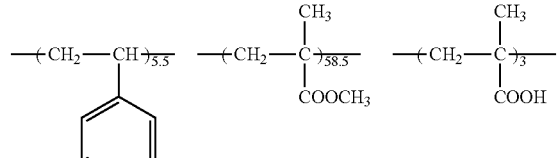

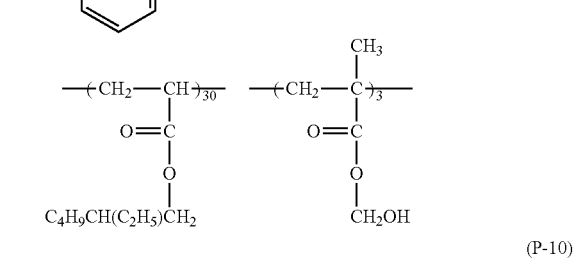
(P-10)

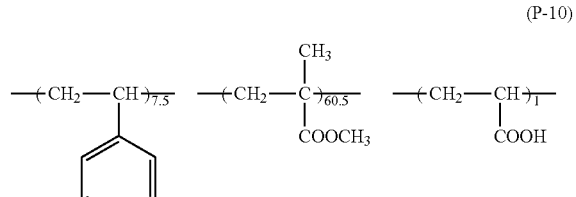

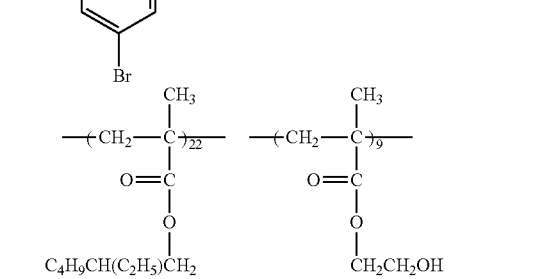

The weight average molecular weight of the polymer expressed by Formula (1) is preferably 1000 to 1000000, more preferably 2000 to 750000, and even more preferably 3000 to 500000.

The polymer expressed by Formula (1) can be synthesized with reference to, for example, JP3305459B and JP3754745B.

The line width of the thin conductive wires 22 is not particularly limited. However, from the viewpoint of making it possible to relatively easily form electrodes having low resistance, the line width is preferably 30 μm or less, more preferably 15 μm or less, even more preferably 10 μm or less, particularly preferably 9 μm or less, and most preferably 7 μm or less. The line width is preferably 0.5 μm or greater, and more preferably 1.0 μm or greater.

The thickness of the thin conductive wires 22 is not particularly limited. However, from the viewpoint of conductive properties and visibility, the thickness can be selected within a range of 0.00001 mm to 0.2 mm. The thickness is preferably 30 μm or less, more preferably 20 μm or less, even more preferably 0.01 μm to 9 μm, and most preferably 0.05 μm to 5 μm.

The lattices 24 include opening regions surrounded by the thin conductive wires 22. A length W of one side of a lattice 24 is preferably 800 µm or less, and more preferably 600 µm or less. In addition, it is preferably 50 µm or greater.

In view of visible light transmittance, the opening ratio in the first detection electrodes 14 and the second detection electrodes 18 is preferably 85% or greater, more preferably 90% or greater, and most preferably 95% or greater. The opening ratio corresponds to a proportion of a transmitting portion, excluding the thin conductive wires 22 of the first detection electrodes 14 or the second detection electrodes 18 in a predetermined region, in the entire region.

The lattices 24 have a nearly rhombus shape. However, the lattices 24 may also have a polygonal shape (for example, a triangular shape, a quadrangular shape, a hexagonal shape, or a random polygonal shape). Moreover, one side of each lattice may have a curved shape or an arc shape other than a linear shape. When one side of each lattice has an arc shape, for example, two sides opposed to each other may have an arc shape curving toward the outside, and the other two sides opposed to each other may have an arc shape curving toward the inside. Furthermore, each side of the lattice may have a wave line shape in which an arc curving toward the outside and an arc curving toward the inside continue. Needless to say, each side of the lattice may have a sine curve shape.

In FIG. 4, the thin conductive wires 22 form a mesh pattern. However, the invention is not limited to this embodiment, and the wires may form a stripe pattern.

In FIG. 1, the first detection electrodes 14 and the second detection electrodes 18 are constituted with a mesh structure of the thin conductive wires 22. However, the invention is not limited to this embodiment, and for example, the detection electrodes may be formed of a thin metal oxide film or metal oxide particles of ITO, ZnO, or the like, a metallic paste such as a silver paste or a copper paste, or metallic nanowire particles such as silver nanowires or copper nanowires. Among these, silver nanowires are preferred in view of excellent conductive properties and transparency.

The patterning of the first detection electrodes 14 and the second detection electrodes 18 can be selected in accordance with the material of the electrode portions, and a photolithographic method, a resist mask screen printing-etching method, an ink jet method, a printing method, and the like may be used.

As illustrated in FIG. 3, the rear surface-side wire 16 is a wire having a wiring portion 32 and a first pad portion 34, electrically connected to an end portion of the first detection electrode 14 at one end thereof, and having the first pad portion 34 at the other end thereof. One end of the wiring portion 32 is electrically connected to the first detection electrode 14, and the other end is electrically connected to the first pad portion 34. The rear surface-side wire 16 is electrically connected to the first detection electrode 14 through a process to be described later, and one end portion thereof forms a first lead-out wire positioned on the front surface side of the substrate 12. That is, the rear surface-side wire 16 is a part of the first lead-out wire.

The rear surface-side wires 16 are arranged on the substrate 12 in the outside region $E_O$.

In FIG. 1, five rear surface-side wires 16 are shown, but the number of the wires is not particularly limited. Usually, more than one rear surface-side wire is arranged in accordance with the number of the detection electrodes. In FIG. 3, the wiring portion 32 and the first pad portion 34 have different heights, but may have the same height.

The material of the rear surface-side wires 16 is not particularly limited, and examples thereof include metals such as gold (Au), silver (Au), copper (Cu), and aluminum (Al) and alloys thereof, and metal oxides such as ITO, tin oxide, zinc oxide, cadmium oxide, gallium oxide, and titanium oxide. Among these, silver is preferred due to having excellent conductive properties.

The rear surface-side wires 16 preferably contain a binder. The types of the binder are as described above (for example, gelatin, a polymer different from gelatin, or the like).

The first pad portions 34 are electrically connected to the second pad portions 36 to be described later via through wires. As will be described below, the second pad portions 36 are positioned in an external conduction region G where a flexible printed wiring board and the like are arranged, and the first pad portions 34 are arranged in a region which is opposed to the external conduction region G on the front surface of the substrate 12 via the substrate.

In FIG. 1, the first pad portions 34 have a circular shape, but the shape is not particularly limited. In addition, in FIG. 1, the first pad portions 34 have a diameter larger than the width of the wiring portions 32, but the size is also not particularly limited.

The second lead-out wires 20 are members acting to apply a voltage to the second detection electrodes 18.

The second lead-out wires 20 are arranged on the substrate 12 in the outside region $E_O$. One ends thereof are electrically connected to end portions of the corresponding second detection electrodes 18, and the other ends thereof are positioned in the external conduction region G where a flexible printed wiring board and the like are arranged, and have pad portions (not shown) (pad portions for external connection).

In FIG. 1, five second lead-out wires 20 are shown, but the number of the wires is not particularly limited. Usually, more than one second lead-out wire is arranged in accordance with the number of the detection electrodes.

The material of the second lead-out wires 20 is not particularly limited, and examples thereof include the material of the rear surface-side wires 16.

The second pad portions 36 are arranged on the front surface side of the substrate 12, and positioned in the external conduction region G where a flexible printed wiring hoard and the like are arranged. That is, the flexible printed wiring board is electrically connected via the second pad portions 36.

The second pad portions 36 are arranged at positions opposed to the first pad portions 34 via the substrate 12. That is, as illustrated in FIG. 1, the second pad portions 36 and the first pad portions 34 are positioned to overlap each other when the substrate 10 with wiring is observed from the front surface side.

The material of the second pad portions 36 is not particularly limited, and examples thereof include metals such as gold (Au), silver (Au), copper (Cu), and aluminum (Al) and alloys thereof, and metal oxides such as ITO, tin oxide, zinc oxide, cadmium oxide, gallium oxide, and titanium oxide. Among these, silver is preferred due to having excellent conductive properties.

The second pad portions 36 preferably contain a binder. The types of the binder are as described above.

In FIG. 1, the second pad portions 36 have a circular shape, but the shape is not particularly limited. The size of the second pad portions 36 is not particularly limited. However, the second pad portions 36 preferably have the same size as the first pad portions 34 in view of producing through holes to be described later.

In FIG. 1, five second pad portions 36 are shown, but the number of the pad portions is not particularly limited.

Usually, more than one second pad portion is arranged in accordance with the number of the detection electrodes.

A binder portion may be further disposed in a part excluding the first detection electrodes 14 and the rear surface-side wires 16 on the front surface and the rear surface of the substrate 12, the second detection electrodes 18, the second lead-out wires 20, and the second pad portions 36.

The binder portion contains gelatin or a polymer different from gelatin.

<Method for Forming Substrate 10 with Wiring>

The method for forming the above-described substrate 10 with wiring is not particularly limited, and known methods can be employed.

Among these, a method using silver halide is exemplified in view of excellent productivity and easy position control of the members. More specifically, a method having Process (1) of forming a silver halide emulsion layer (hereinafter, may also be simply referred to as a photosensitive layer) containing silver halide and gelatin on both surfaces of the substrate 12 and Process (2) of exposing the photosensitive layer to light and then performing a development treatment to form the first detection electrodes 14 and the rear surface-side wires 16 as well as the second detection electrodes 18, the second lead-out wires 20, and the second pad portions 36 is exemplified.

Hereinbelow, the processes will be described.

[Process (1): Photosensitive Layer Forming Process]

Process (1) is a process of forming a photosensitive layer containing silver halide and gelatin on both surfaces of a substrate 12.

The method for forming the photosensitive layer is not particularly limited. However, in view of productivity, a method in which a composition for forming a photosensitive layer containing silver halide and gelatin is brought into contact with the substrate 12 to form a photosensitive layer on both surfaces of the substrate 12 is preferred.

Hereinbelow, embodiments of the composition for forming a photosensitive layer used in the above-described method will be described in detail, and then the procedure of the process will be described in detail.

The composition for forming a photosensitive layer contains silver halide and gelatin.

The halogen element contained in the silver halide may be any of chlorine, bromine, iodine, and fluorine, and these may be used in combination. As the silver halide, for example, silver halide containing silver chloride, silver bromide, or silver iodide as a main component is preferably used, and silver halide containing silver bromide or silver chloride as a main component is more preferably used.

The types of the gelatin are as described above.

The volume ratio between the silver halide and the gelatin contained in the composition for forming a photosensitive layer is not particularly limited, and is appropriately adjusted so as to fall within the above-described preferable range of the volume ratio between the metal and the binder in the thin conductive wires 22.

If necessary, the composition for forming a photosensitive layer contains a solvent.

Examples of the solvent to be used include water, organic solvents (for example, alcohols such as methanol, ketones such as acetone, amides such as formamide, sulfoxides such as dimethyl sulfoxide, esters such as ethyl acetate, and ethers), ionic liquids, and mixed solvents of the aforementioned solvents.

The content of the solvent to be used is not particularly limited. However, it is preferably within a range of 30% by mass to 90% by mass, and more preferably within a range of 50% by mass to 80% by mass, with respect to the total mass of the silver halide and the binder.

If necessary, the composition for forming a photosensitive layer may contain other materials in addition to the above-described materials. Examples thereof include a rhodium compound which is used for stabilization of the silver halide and an increase in sensitivity and a metallic compound such as an iridium compound belonging to Group VIII or Group VIIB. Other examples thereof include an antistatic agent, a nucleation promoter, a spectral sensitizing dye, a surfactant, an antifogging agent, a hardening agent, a black spot preventing agent, a redox compound, a monomethine compound, and dihydroxybenzenes as described in Paragraphs [0220] to [0241] of JP2009-004348A. Physical development nuclei may be contained.

A binder (for example, a polymer different from gelatin) other than the gelatin may be contained.

Among these, when the photosensitive layer contains the polymer, a crosslinking agent which is used for crosslinking between the polymers is preferably contained. When the crosslinking agent is contained, crosslinking between the polymers proceeds, and the connection between metallic silver atoms in the conductive portion is maintained even when the gelatin is decomposed and removed. As a result, a conductive film having excellent conductive characteristics is obtained.

The type of the crosslinking agent to be used is not particularly limited and an optimum crosslinking agent is appropriately selected in accordance with the structure of the polymer to be used. Usually, the crosslinking agent has at least two cross-linking groups reacting with a group (reactive group) contained in the polymer.

Examples of the appropriate combination between the reactive group in the polymer and the cross-linking group in the crosslinking agent include the following combinations (1) to (8) in view of more excellent reactivity.

(1) Hydroxyl Group and Isocyanate Group
(2) Carboxylic Acid Group and Epoxy Group
(3) Hydroxyl Group and Carboxylic Anhydride Group
(4) Carboxylic Acid Group and Isocyanate Group
(5) Amino Group and Isocyanate Group
(6) Hydroxyl Group and Epoxy Group
(7) Amino Group and Epoxy Group
(8) Amino Group and Halogenated Alkyl Group Examples of the crosslinking agent include vinyl sulfones (for example, 1,3-bis-vinyl sulfonyl propane), aldehydes (for example, glyoxal), pyrimidine chlorides (for example, 2,4,6-trichloropyrimidine), triazine chlorides (for example, cyanuric chloride), epoxy compounds, and carbodiimide compounds. A crosslinking agent allowing the crosslinking reaction to proceed using a photochemical reaction induced by light irradiation may be used.

(Procedure of Process)

The method for bringing the composition for forming a photosensitive layer into contact with the substrate 12 is not particularly limited, and known methods can be employed. Examples thereof include a method for coating the substrate 12 with the composition for forming a photosensitive layer and a method for dipping the substrate 12 in the composition for forming a photosensitive layer.

The content of the silver halide in the photosensitive layer is not particularly limited. However, it is preferably 1.0 g/m$^2$ to 20.0 g/m$^2$, and more preferably 5.0 g/m$^2$ to 15.0 g/m$^2$ in terms of silver in view of more excellent conductive characteristics.

If necessary, a protective layer formed of a binder may be further provided on the photosensitive layer. When the protective layer is provided, scratches are prevented and dynamic characteristics are improved.

[Process (2): Exposure and Development Process]

Process (2) is a process of performing pattern exposure on the photosensitive layer obtained in the above-described Process (1) and then performing a development treatment to form first detection electrodes 14 and rear surface-side wires 16 as well as second detection electrodes 18, second lead-out wires 20, and second pad portions 36.

Hereinbelow, first, the pattern exposure treatment will be described in detail, and then the development treatment will be described in detail.

(Pattern Exposure)

When the photosensitive layer is subjected to pattern exposure, the silver halide in the photosensitive layer in the exposed region forms a latent image. In the region in which the latent image is formed, the first detection electrodes 14 and the rear surface-side wires 16, as well as the second detection electrodes 18, the second lead-out wires 20, and the second pad portions 36 are formed through the development treatment to be described later. In contrast, in the unexposed region that is not exposed to light, the silver halide is dissolved and flows out of the photosensitive layer at the time of a fixing treatment to be described later, and thus a transparent film (the above-described binder portion) is obtained.

The light source which is used for exposure is not particularly limited, and examples thereof include light such as visible rays and ultraviolet rays and radiation such as X-rays.

The method for performing the pattern exposure is not particularly limited. For example, the pattern exposure may be performed by either surface exposure using a photomask or scanning exposure using laser beams. The shape of the pattern is not particularly limited and appropriately adjusted in accordance with an intended pattern to be formed.

(Development Treatment)

The method of development treatment is not particularly limited, but for example, can be selected from the following three methods in accordance with the type of the photosensitive layer.

(1) A method for forming metallic silver by subjecting a photosensitive layer containing no physical development nuclei to chemical development or thermal development.

(2) A method for forming metallic silver by subjecting a photosensitive layer containing physical development nuclei to solution physical development.

(3) A method for forming metallic silver by overlapping a photosensitive layer containing no physical development nuclei and an image receiving sheet having a non-photosensitive layer containing physical development nuclei and by subjecting them to diffusion transfer development.

The meanings of the chemical development, thermal development, solution physical development, and diffusion transfer development mentioned herein are terms usually used in the art, and are described in general textbooks of photographic chemistry such as "Photographic Chemistry" (published by kyoritsu Shuppan) written by Shinichi Kikuchi and "The Theory of Photographic Process, 4th ed" (Mcmillan, published in 1977) edited by C. E. K. Mees. For example, the technologies described in JP2004-184693A, JP2004-334077A, JP2005-010752A, and the like may also be referred to.

Among the above-described Methods (1) to (3), Method (1) is the simplest and most stable process and is thus preferred in manufacturing of the conductive sheet of the invention since the photosensitive layer before development has no physical development nuclei and diffusion transfer development of two sheets is not performed in Method (1).

The method of development treatment is not particularly limited, and known methods can be employed. For example, it is possible to use general development treatment technologies used for silver halide photographic films, photographic printing paper, films for printing plate making, emulsion masks for a photomask, and the like.

The type of the developer which is used in the development treatment is not particularly limited, and for example, a PQ developer, an MQ developer, an MAA developer, and the like can be used. As commercially available products, for example, developers such as CN-16, CR-56, CP45X, FD-3, and Papitol formulated by Fujifilm Corporation, C-41, E-6, RA-4, D-19, and D-72 formulated by Eastman Kodak Company, and developers included in the kits thereof can be used. Furthermore, a lith developer can be used.

The development treatment may include a fixing treatment which is performed for stabilization by removing silver halide in an unexposed portion. In the fixing treatment, technologies of the fixing treatment which are used for silver halide photographic films, photographic printing paper, films for printing plate making, emulsion masks for a photomask, and the like can be used.

In the fixing treatment, the fixing temperature is preferably about 20° C. to about 50° C., and more preferably 25° C. to 45° C. The fixing time is preferably 5 seconds to 1 minute, and more preferably 7 seconds to 50 seconds.

The mass of the metallic silver contained in the exposed portion after the development treatment is preferably 50% by mass or greater, and more preferably 80% by mass or greater with respect to the mass of the silver contained in the exposed portion before the exposure. The mass of the silver contained in the exposed portion is preferably 50% by mass or greater with respect to the mass of the silver contained in the exposed portion before the exposure since high conductive properties can be obtained.

<Process B1 (Through Hole Forming Process)>

Figure 5:
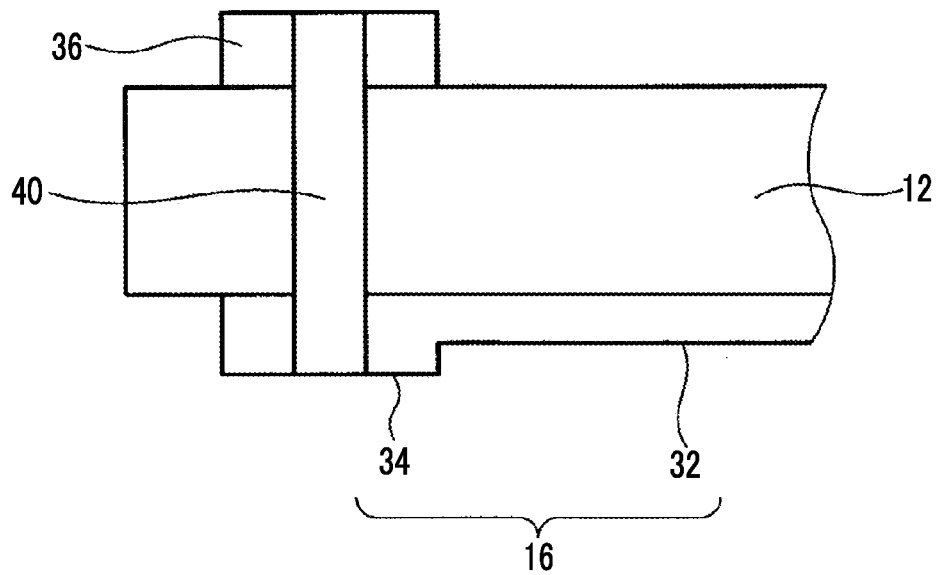
FIG. 5 is a partial enlarged cross-sectional view illustrating a through hole which is formed in Process B1 of the first embodiment of the method for manufacturing a touch-panel conductive sheet of the invention.

Process B1 is a process of forming through holes penetrating the first pad portions, the substrate, and the second pad portions. More specifically, as illustrated in FIG. 5, a through hole 40 penetrating the first pad portion 34, the substrate 12, and the second pad portion 36 is formed. FIG. 5 is a partial enlarged cross-sectional view in a position taken along cutting line B-B shown in FIG. 1 after Process B1 is performed.

The method for forming the through holes 40 is not particularly limited, and known methods such as drilling and laser processing can be employed. Among these, laser processing is preferred in view of productivity.

The laser device to be used is not particularly limited, and examples thereof include a YAG laser device and a $CO_2$ laser device. The through holes 40 can be formed by applying laser light toward the surface of the first pad portion 34 or the second pad portion 36 in a direction perpendicular to the surface of the first pad portion 34 or the second pad portion 36.

As conditions for outputting laser light, optimum conditions are appropriately selected in accordance with the material of the first pad portion 34 or the second pad portion 36.

In some cases, a baking remainder (called smear) adheres to an inner wall surface of the through hole 40 due to laser light irradiation. Accordingly, if necessary, a desmear treatment may be performed to remove the smear after the laser processing. As the desmear treatment, a plasma treatment may be performed using, for example, an argon gas plasma using microwaves or an oxygen gas plasma.

The diameter of the formed through hole is not particularly limited. Usually, the diameter is smaller than those of the first pad portion 34 and the second pad portion 36 in many cases.

<Process C1 (Filling Process)>

Process C1 is a process of producing through wires which electrically connect the first pad portions and the second pad portions by filling the through holes with a conductive material to form first lead-out wires which include the rear surface-side wires and the through wires and are electrically connected to the first detection electrodes.

Figure 6:
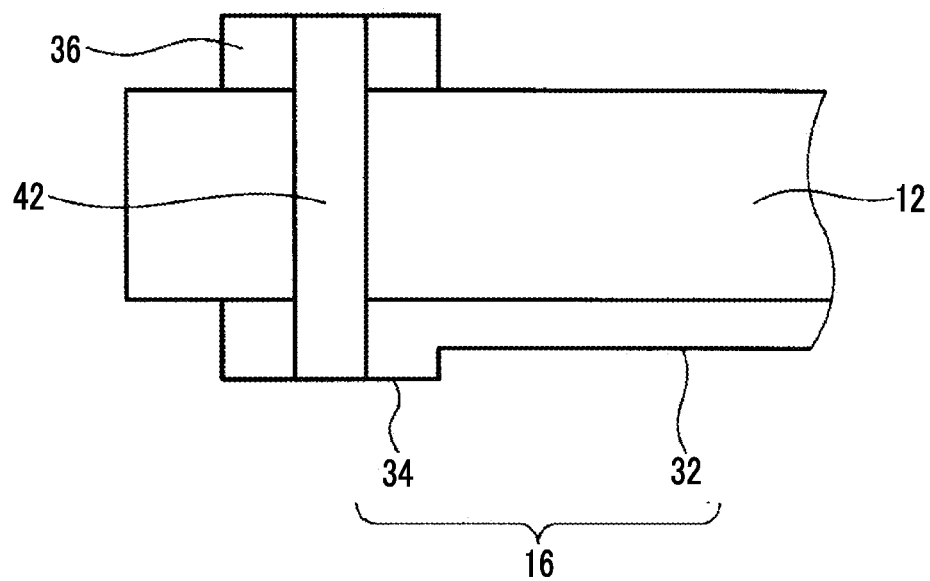
FIG. 6 is a partial enlarged cross-sectional view illustrating a through wire which is formed in Process C1 of the first embodiment of the method for manufacturing a touch-panel conductive sheet of the invention.

More specifically, as illustrated in FIG. 6, the through holes 40 formed in the above-described Process B1 are filled with a conductive material to form through wires 42. The through wires 42 act to electrically connect the first pad portions 34 and the second pad portions 36. Due to the formation of the through wires 42, the second pad portions 36 and the rear surface-side wires 16 are electrically connected. As a result, the first lead-out wires including the rear surface-side wires 16, the through wires 42, and the second pad portions 36 are formed. One ends of the first lead-out wires are electrically connected to the first detection electrodes 14, and the other ends (second pad portions 36) thereof are positioned on the front surface side of the substrate 12.

The type of the conductive material to be used is not particularly limited, and examples thereof include metallic materials such as copper, silver, gold, chromium, aluminum, and nickel, conductive polymers, and carbons.

The method for filling with the conductive material is not particularly limited, and known methods can be employed. Examples thereof include a method for ejecting an ink (paste) containing the conductive material into through holes through an ink jet method to fill the through holes.

In many cases, a flexible printed wiring board is connected to a conductive sheet obtained through the above-described processes. The flexible printed wiring board is disposed in the external conduction region G in FIG. 1 and is electrically connected to one ends (second pad portions 36) of the first lead-out wires and one ends (pad portions (not shown)) of the second lead-out wires.

The flexible printed wiring board is a substrate on which a plurality of wires and terminals are provided, and acts to connect a conductive sheet and an external device (for example, liquid crystal display device).

In the conductive sheet obtained through the above-described processes, the first detection electrodes, the second detection electrodes, the first lead-out wires, and the second lead-out wires are preferably made of the same metallic material. In the above-described embodiment, conductive characteristics between the respective electrodes and wires are the same, and thus the voltage to be applied is easily controlled.

The conductive sheet of the invention is incorporated and used in a touch panel (capacitive touch panel).

An input position detection operation of a touch panel including a conductive sheet will be described.

When a finger which is a conductor approaches, touches, or presses an operating surface of the substrate corresponding to the input region $E_I$, capacitance between the finger and the first and second detection electrodes changes. Here, a position detection driver always detects a change in capacitance between the finger and the first and second detection electrodes. When detecting a change in capacitance that is equal to or greater than a predetermined value, the position detection driver detects the position where the change in capacitance is detected as an input position. In this manner, the touch panel can detect the input position. As the input position detection method of the touch panel, any of a mutual capacitance method and a self capacitance method may be used. The mutual capacitance method is more preferably employed than the self capacitance method since a plurality of input positions can be detected at the same time.

<Second Embodiment>

A second embodiment of the method for manufacturing a touch-panel conductive sheet of the invention includes at least Process A2 of forming detection electrodes, lead-out wires, and the like on a substrate, Process B1 of forming through holes at predetermined positions, and Process C1 of filling the through holes with a conductive material.

The second embodiment of the method for manufacturing a conductive sheet has the same processes as in the above-described first embodiment, except that Process A2 is different.

Hereinbelow, Process A2 will be mainly described in detail.

[Process A2 (Wiring Forming Process)]

Process A2 is a process of forming, on a rear surface of a substrate, first detection electrodes and first pad portions which are electrically connected to end portions of the first detection electrodes, and on a front surface of the substrate, second detection electrodes, second lead-out wires which are electrically connected to the second detection electrodes, and front surface-side wires which have second pad portions arranged at positions opposed to the first pad portions via the substrate and wiring portions electrically connected to the second pad portions.

Figure 7:
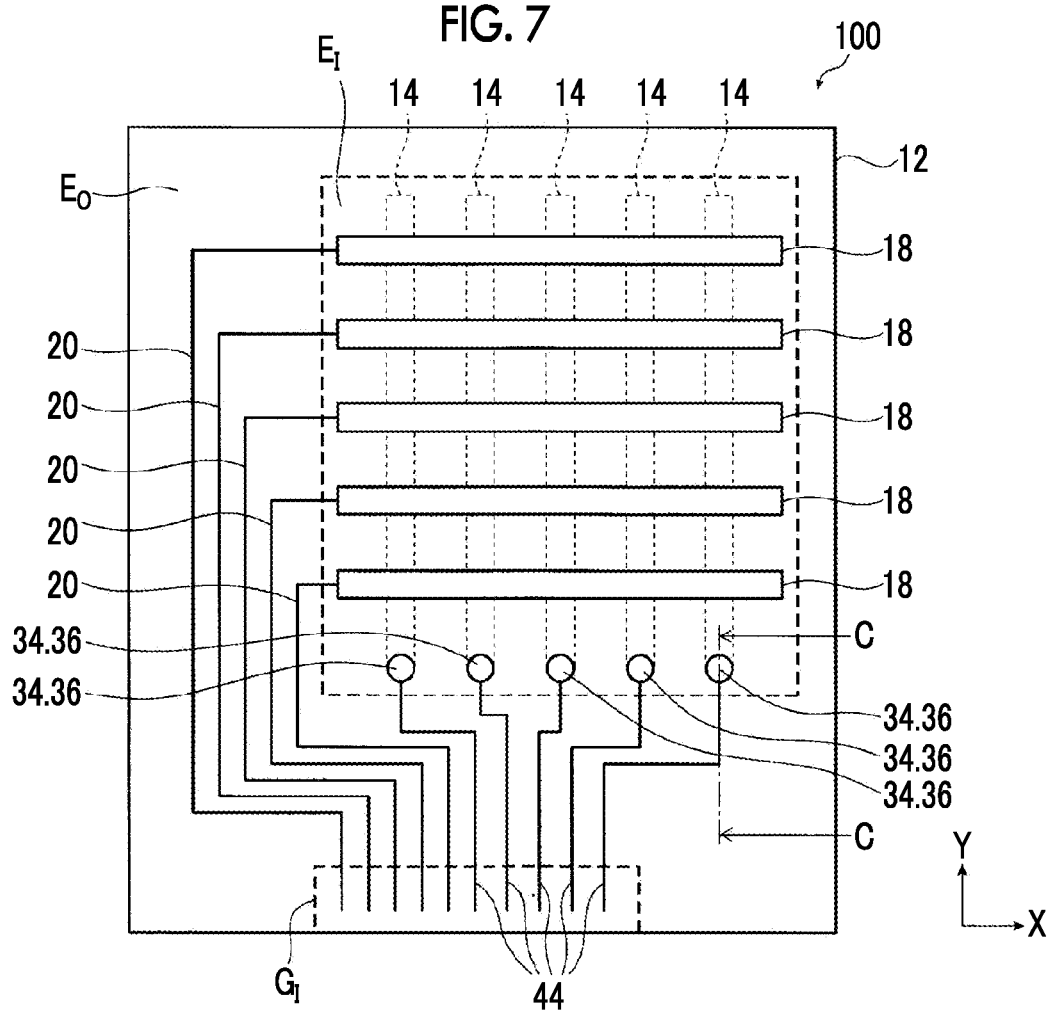
FIG. 7 is a plan view of a substrate with wiring which is formed in Process A2 of a second embodiment of the method for manufacturing a touch-panel conductive sheet of the invention.
Figure 8:
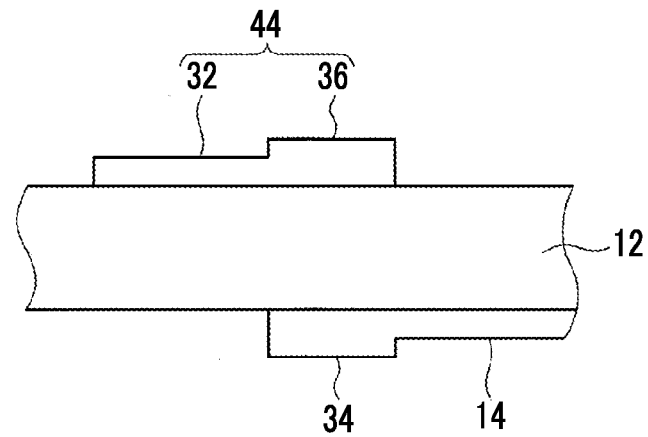
FIG. 8 is a cross-sectional view taken along cutting line C-C shown in FIG. 7.

FIG. 7 illustrates a plan view of a substrate 100 with wiring which is obtained through the above-described Process A2. FIG. 8 is a cross-sectional view taken along cutting line C-C.

As illustrated in FIG. 7, the substrate 100 with wiring obtained through the above-described Process A2 is provided with a substrate 12, first detection electrodes 14 arranged on a rear surface of the substrate 12, first pad portions 34 electrically connected to end portions of the first detection electrodes 14, second detection electrodes 18 arranged on a front surface of the substrate 12, second lead-out wires 20, and front surface-side wires 44 having second pad portions 36 arranged at positions opposed to the first pad portions 34 via the substrate 12 and wiring portions 32 electrically connected to the second pad portions 36.

When compared to the substrate 10 with wiring shown in the first embodiment, the substrate 100 with wiring is the same as the substrate 10 with wiring in terms of the configurations and the positions of the first detection electrodes 14, the second detection electrodes 18, and the second lead-out wires 20, but is different therefrom in terms of the first pad portions 34 and the front surface-side wires 44.

Hereinbelow, the first pad portions 34 and the front surface-side wires 44 will be described in detail.

The first pad portions 34 are at different positions when compared to the first embodiment.

In the second embodiment, as illustrated in FIG. 8, the first pad portions 34 are arranged at positions electrically connected to end portions of the first detection electrodes 14.

The material, the size, and the like of the first pad portions 34 are as described above.

The front surface-side wires 44 have the second pad portions 36 arranged at positions opposed to the first pad portions 34 via the substrate 12, and the wiring portions 32 electrically connected to the second pad portions 36. The front surface-side wires 44 form first lead-out wires which are electrically connected to the first detection electrodes 14 and of which one ends are positioned on the front surface side of the substrate 12 through Process B1 and Process C1. That is, the front surface-side wires 44 form a part of the first lead-out wires.

The front surface-side wires 44 are arranged on the substrate 12 in an outside region $E_O$.

In FIG. 7, five front surface-side wires 44 are shown, but the number of the wires is not particularly limited. Usually, more than one front surface-side wire is arranged in accordance with the number of the detection electrodes. In FIG. 8, the wiring portion 32 and the second pad portion 36 have different heights, but may have the same height. In FIG. 8, the first detection electrode 14 and the first pad portion 34 have different heights, but may have the same height.

The material of the front surface-side wires 44 is not particularly limited, and examples thereof include metals such as gold (Au), silver (Au), copper (Cu), and aluminum (Al) and alloys thereof, and metal oxides such as ITO, tin oxide, zinc oxide, cadmium oxide, gallium oxide, and titanium oxide. Among these, silver is preferred due to having excellent conductive properties.

The front surface-side wires 44 preferably contain a binder. The types of the binder are as described above (for example, gelatin, a polymer different from gelatin, or the like).

The second pad portions 36 are arranged at positions opposed to the first pad portions 34, and are electrically connected via through wires through Process B1 and Process C1.

The material, the size, and the like of the second pad portions 36 are as described above.

The other ends of the front surface-side wires 44 on the side opposite to the second pad portions 36 are positioned in an external conduction region G where a flexible printed wiring board and the like are arranged, and have pad portions (not shown) (pad portions for external connection).

A forming method similar to that of the first embodiment is performed as a method for forming the substrate 100 with wiring.

By performing the above-described Process B1 and Process C1 on the substrate with wiring, the first lead-out wires which include the first pad portions, the through wires, and the front surface-side wires and of which one ends are electrically connected to the first detection electrodes and the other ends are positioned on the front surface side of the substrate are formed.

<Third Embodiment>

A third embodiment of the method for manufacturing a touch-panel conductive sheet of the invention includes at least Process A3 of forming detection electrodes, lead-out wires, and the like on a substrate, Process B1 of forming through holes at predetermined positions, and Process C1 of filling the through holes with a conductive material.

The third embodiment of the method for manufacturing a conductive sheet has the same processes as in the above-described first embodiment, except that Process A3 is different.

Hereinbelow, Process A3 will be mainly described in detail.

[Process A3 (Wiring Forming Process)]

Process A3 is a process of forming, on a rear surface of a substrate, first detection electrodes and rear surface-side wires of which one ends are electrically connected to the first detection electrodes and the other ends have first pad portions, and on a front surface of the substrate, second detection electrodes, second lead-out wires which are electrically connected to the second detection electrodes, and front surface-side wires which have second pad portions arranged at positions opposed to the first pad portions via the substrate and wiring portions electrically connected to the second pad portions.

Figure 9:
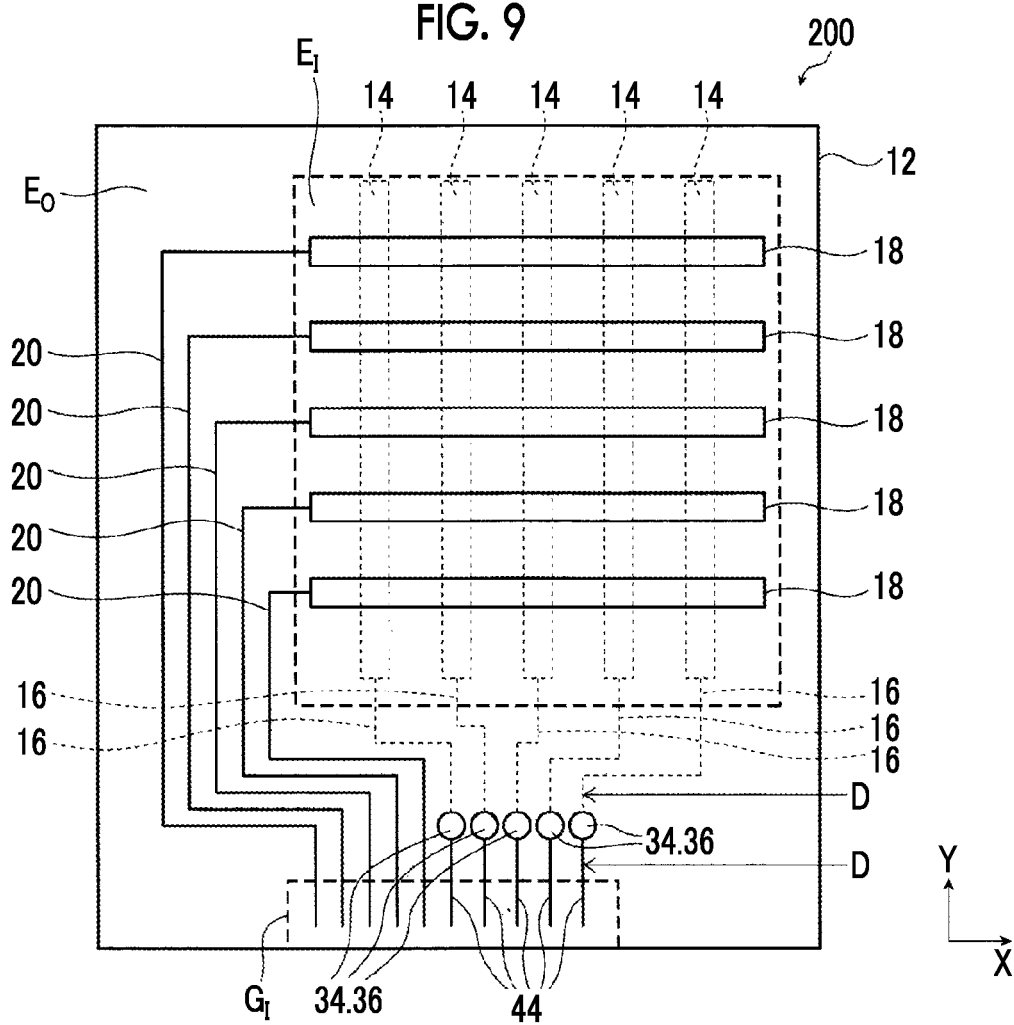
FIG. 9 is a plan view of a substrate with wiring which is formed through Process A3 of a third embodiment of the method for manufacturing a touch-panel conductive sheet of the invention.
Figure 10:
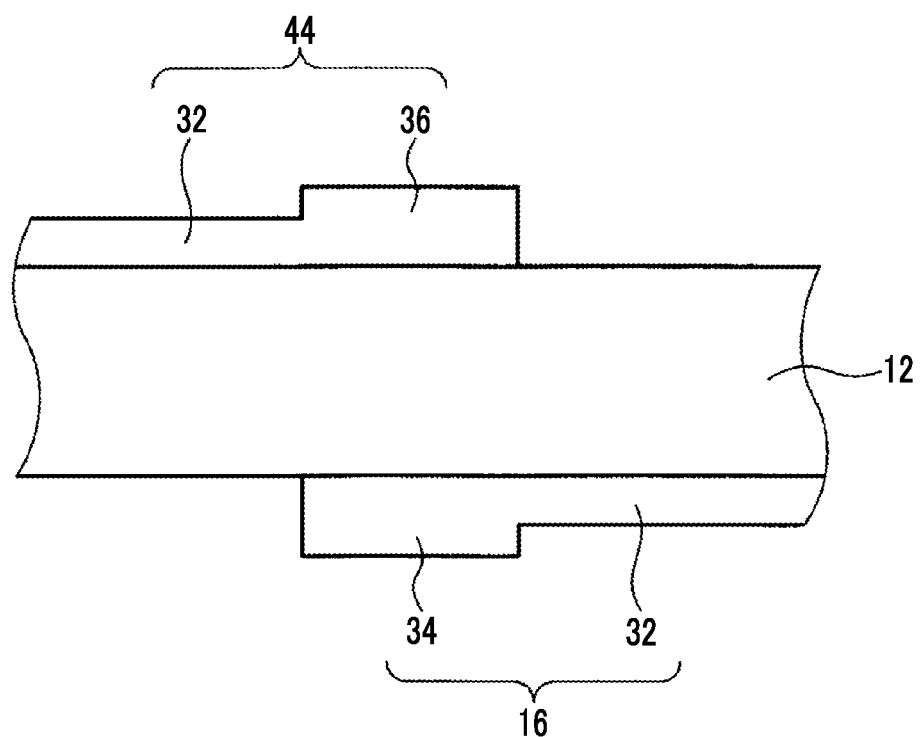
FIG. 10 is a cross-sectional view taken along cutting line D-D shown in FIG. 9.

FIG. 9 illustrates a plan view of a substrate 200 with wiring which is obtained in the above-described Process A3. FIG. 10 is a cross-sectional view taken along cutting line D-D.

As illustrated in FIG. 9, the substrate 200 with wiring obtained through the above-described Process A3 is provided with a substrate 12, first detection electrodes 14 arranged on a rear surface of the substrate 12, rear surface-side wires 16 of which one ends are electrically connected to end portions of the first detection electrodes 14 and the other ends have first pad portions 34, second detection electrodes 18 arranged on a front surface of the substrate 12, second lead-out wires 20, and front surface-side wires 44 having second pad portions 36 arranged at positions opposed to the first pad portions 34 via the substrate 12 and wiring portions 32 electrically connected to the second pad portions 36.

Since the first detection electrodes 14, the second detection electrodes 18, the rear surface-side wires 16, and the second lead-out wires 20 in the substrate 200 with wiring are the same as the members in the substrate 10 with wiring in the first embodiment, and the front surface-side wires 44 in the substrate 200 with wiring are the same as the front surface-side wires 44 in the substrate 100 with wiring in the second embodiment, detailed descriptions thereof will be omitted.

As illustrated in FIG. 10, the second pad portions 36 are arranged at positions opposed to the first pad portions 34, and are electrically connected via through wires through Process B1 and Process C1.

The other ends of the front surface-side wires 44 on the side opposite to the second pad portions 36 are positioned in an external conduction region G where a flexible printed wiring board and the like are arranged, and have pad portions (not shown) (pad portions for external connection).

A forming method similar to that of the first embodiment is performed as a method for forming the substrate 200 with wiring.

By performing the above-described Process B1 and Process C1 on the substrate with wiring, first lead-out wires which include the rear surface-side wires, the through wires, and the front surface-side wires and of which one ends are electrically connected to the first detection electrodes and the other ends are positioned on the front surface side of the substrate are formed.

EXAMPLES

Hereinbelow, the invention will be described in more detail using an example, but is not limited thereto.

Example 1

(Preparation of Silver Halide Emulsion)

To the following Liquid 1 kept at 38° C. and at a pH of 4.5, 90% of the following Liquid 2 and Liquid 3 were simultaneously added over 20 minutes while being stirred, thereby forming 0.16 μm of nuclear particles. Subsequently, the following Liquid 4 and Liquid 5 were added thereto over 8 minutes, and then the remaining 10% of the following Liquid 2 and Liquid 3 were added thereto over 2 minutes, so that the size of the particles increased to 0.21 μm. Thereafter, 0.15 g of potassium iodide was added thereto, the particles were allowed to mature for 5 minutes, and then the formation of particles was terminated.

Liquid 1:
Water: 750 ml
Gelatin: 9 g
Sodium Chloride: 3 g
1,3-Dimethylimidazolidine-2-Thione: 20 mg
Sodium Benzene Thiosulfonate: 10 mg
Citric Acid: 0.7 g
Liquid 2:
Water: 300 ml
Silver Nitrate: 150 g
Liquid 3:
Water: 300 ml
Sodium Chloride: 38 g
Potassium Bromide: 32 g
Potassium Hexachloroiridate (III) (0.005% KCl 20% aqueous solution): 8 ml
Ammonium Hexachlororhodate (0.001% NaCl 20% aqueous solution): 10 ml
Liquid 4:
Water: 100 ml
Silver Nitrate: 50 g
Liquid 5:
Water: 100 ml
Sodium Chloride: 13 g
Potassium Bromide: 11 g
Potassium Ferrocyanide: 5 mg Thereafter, the resultant was washed with water through a flocculation method in accordance with a common method. Specifically, the resultant was cooled to 35° C., and a pH thereof was reduced using sulfuric acid until the silver halide was precipitated (the pH was 3.6±0.2). Next, approximately 3 L of the supernatant liquid was removed (first washing with water). Subsequently, 3 L of distilled water was added thereto, and then a sulfuric acid was added thereto until the silver halide was precipitated. 3 L of the supernatant liquid was removed again (second washing with water). The same operation as the second washing with water was repeated once (third washing with water), and the process of washing with water and demineralization was terminated. The pH of the emulsion after the washing with water and demineralization was adjusted to 6.4, pAg thereof was adjusted to 7.5, and by adding 3.9 g of gelatin, 10 mg of sodium benzene thiosulfonate, 3 mg of sodium benzene thiosulfinate, 15 mg of sodium thiosulfate, and 10 mg of chloroauric acid thereto, chemical sensitization was performed so that the emulsion exhibited optimal sensitivity at 55° C. 100 mg of 1,3,3a,7-tetraazaindene as a stabilizer and 100 mg of Proxel (product name, manufactured by ICI Co., Ltd.) as a preservative were added thereto. The finally obtained emulsion was an emulsion of cubic silver iodochlorobromide particles which contained 0.08 mol % of silver iodide and silver chlorobromide composed of silver chloride and silver bromide at a ratio of 70 mol % and 30 mol %, and had an average particle size of 0.22 μm and a coefficient of variation of 9%.

(Preparation of Composition for Forming Photosensitive Layer)

$1.2 \times 10^{-4}$ mol/mol Ag of 1,3,3a,7-tetraazaindene, $1.2 \times 10^{-2}$ mol/mol Ag of hydroquinone, $3.0 \times 10^{-4}$ mol/mol Ag of a citric acid, and 0.90 g/mol Ag of 2,4-dichloro-6-hydroxy-1,3,5-triazine sodium salt were added to the emulsion. Using the citric acid, the pH of the coating liquid was adjusted to 5.6, thereby obtaining a composition for forming a photosensitive layer.

(Photosensitive Layer Forming Process)

A polyethylene terephthalate (PET) film having a thickness of 100 μm was subjected to a corona discharge treatment. Thereafter, on both surfaces of the PET film, a gelatin layer having a thickness of 0.1 μm was provided as an undercoat layer, and on the undercoat layer, an anti-halation layer, having an optical density of approximately 1.0 and containing a dye that is bleached by alkali of a developer, was provided. The composition for forming a photosensitive layer was coated onto the anti-halation layer, and a gelatin layer having a thickness of 0.15 μm was provided thereon, thereby obtaining a PET film in which a photosensitive layer was formed on both surfaces thereof. The obtained film was named film A. The formed photosensitive layer contained silver in an amount of 6.0 g/m$^2$ and gelatin in an amount of 1.0 g/m$^2$.

(Exposure and Development Process)

Both surfaces of the above-described film A were subjected to exposure using parallel light from a high-pressure mercury lamp as a light source through a photomask in which first detection electrodes, second detection electrodes, rear surface-side wires, second lead-out wires, and second pad portions were arranged as illustrated in FIG. 1. After the exposure, the film was developed with the following developer and further subjected to a development treatment using a fixing solution (product name: N3X-R for CN16X, manufactured by Fujifilm Corporation). The film was rinsed with pure water and dried, thereby obtaining a PET film in which a wiring pattern composed of thin Ag wires and a gelatin layer were formed on both surfaces. The gelatin layer was formed between the thin Ag wires. The obtained film was named film B.

(Composition of Developer)

1 L of the developer contains the following compounds.
Hydroquinone: 0.037 mol/L
N-methylaminophenol: 0.016 mol/L
Sodium Metaborate: 0.140 mol/L
Sodium Hydroxide: 0.360 mol/L
Sodium Bromide: 0.031 mol/L
Potassium Metabisulphite: 0.187 mol/L Next, through holes penetrating the second pad portions, the substrate, and the first pad portions were formed by laser irradiation from surfaces of the second pad portions of the film B obtained as described above.

Next, using an ink jet device, the through holes were filled with a conductive material and a heating treatment was performed to form through wires, and thus first lead-out wires including the rear surface-side wires and the through wires were formed.

The above-described Example 1 was performed using the substrate 10 with wiring illustrated in FIG. 1, but a desired touch-panel conductive sheet was manufactured also in a case using the above-described substrate 100 with wiring or substrate 200 with wiring.

What is claimed is:
1. A touch-panel conductive sheet comprising:
a substrate;
first detection electrodes which are arranged on a rear surface of the substrate;

first lead-out wires of which one ends are electrically connected to the first detection electrodes and the other ends are arranged on a front surface of the substrate, and which include through wires as a part;
second detection electrodes which are arranged on the front surface of the substrate; and
second lead-out wires which are electrically connected to the second detection electrodes,
wherein the first detection electrodes, the second detection electrodes, the first lead-out wires, and the second lead-out wires contain the same metallic material,
wherein the through wires are electrically connected to the first pad portions and second pad portions by through holes filled with a conductive material,
wherein the through holes penetrate the first pad portions, the substrate, and the second pad portions,
wherein the first pad portions are provided at end portions of the first detection electrodes or at the first lead-out wires, and
wherein the second pad portions are arranged at positions opposed to the first pad portions via the substrate.

2. The touch-panel conductive sheet according to claim 1, wherein the first pad portions have same size as the second pad portions.

3. The touch-panel conductive sheet according to claim 1, wherein the first pad portions and the second pad portions have a circular shape.

4. The touch-panel conductive sheet according to claim 1, wherein the through holes have a diameter smaller than those of the first pad portion and the second pad portion.

5. A method for manufacturing a touch-panel conductive sheet, comprising:
forming, on a rear surface of a substrate, first detection electrodes and rear surface-side wires of which one ends are electrically connected to the first detection electrodes and the other ends have first pad portions, and on a front surface of the substrate, second detection electrodes, second lead-out wires which are electrically connected to the second detection electrodes, and second pad portions which are arranged at positions opposed to the first pad portions via the substrate;
forming through holes penetrating the first pad portions, the substrate, and the second pad portions; and
producing through wires which electrically connect the first pad portions and the second pad portions by filling the through holes with a conductive material to form first lead-out wires which include the rear surface-side wires and the through wires and are electrically connected to the first detection electrodes.

6. The method for manufacturing a touch-panel conductive sheet according to claim 5,
wherein the first detection electrodes, the second detection electrodes, the first lead-out wires, and the second lead-out wires are made of the same metallic material.

7. The method for manufacturing a touch-panel conductive sheet according to claim 5,
wherein the first pad portions have a same size as the second pad portions.

8. The method for manufacturing a touch-panel conductive sheet according to claim 5,
wherein the first pad portions and the second pad portions have a circular shape.

9. The method for manufacturing a touch-panel conductive sheet according to claim 5,
wherein the through holes have a diameter smaller than those of the first pad portion and the second pad portion.

10. The method for manufacturing a touch-panel conductive sheet according to claim 5,
wherein the through holes are formed by drilling processing and laser processing.

11. A method for manufacturing a touch-panel conductive sheet, comprising:
forming, on a rear surface of a substrate, first detection electrodes and first pad portions which are electrically connected to end portions of the first detection electrodes, and on a front surface of the substrate, second detection electrodes, second lead-out wires which are electrically connected to the second detection electrodes, and front surface-side wires which have second pad portions arranged at positions opposed to the first pad portions via the substrate and wiring portions electrically connected to the second pad portions;
forming through holes penetrating the first pad portions, the substrate, and the second pad portions; and
producing through wires which electrically connect the first pad portions and the second pad portions by filling the through holes with a conductive material to form first lead-out wires which include the front surface-side wires and the through wires and are electrically connected to the first detection electrodes.

12. The method for manufacturing a touch-panel conductive sheet according to claim 11,
wherein the first detection electrodes, the second detection electrodes, the first lead-out wires, and the second lead-out wires are made of the same metallic material.

13. The method for manufacturing a touch-panel conductive sheet according to claim 11,
wherein the first pad portions have a same size as the second pad portions.

14. The method for manufacturing a touch-panel conductive sheet according to claim 11,
wherein the first pad portions and the second pad portions have a circular shape.

15. The method for manufacturing a touch-panel conductive sheet according to claim 11,
wherein the through holes have a diameter smaller than those of the first pad portion and the second pad portion.

16. The method for manufacturing a touch-panel conductive sheet according to claim 11,
wherein the through holes are formed by drilling processing and laser processing.

17. A method for manufacturing a touch-panel conductive sheet, comprising:
forming, on a rear surface of a substrate, first detection electrodes and rear surface-side wires of which one ends are electrically connected to the first detection electrodes and the other ends have first pad portions, and on a front surface of the substrate, second detection electrodes, second lead-out wires which are electrically connected to the second detection electrodes, and front surface-side wires which have second pad portions arranged at positions opposed to the first pad portions via the substrate and wiring portions electrically connected to the second pad portions;
forming through holes penetrating the first pad portions, the substrate, and the second pad portions; and
producing through wires which electrically connect the first pad portions and the second pad portions by filling the through holes with a conductive material to form first lead-out wires which include the front surface-side wires, the through wires, and the rear surface-side wires and are electrically connected to the first detection electrodes.

18. The method for manufacturing a touch-panel conductive sheet according to claim 17,
wherein the first detection electrodes, the second detection electrodes, the first lead-out wires, and the second lead-out wires are made of the same metallic material.

19. The method for manufacturing a touch-panel conductive sheet according to claim 17,
wherein the first pad portions have a same size as the second pad portions.

20. The method for manufacturing a touch-panel conductive sheet according to claim 17,
wherein the first pad portions and the second pad portions have a circular shape.

21. The method for manufacturing a touch-panel conductive sheet according to claim 17,
wherein the through holes have a diameter smaller than those of the first pad portion and the second pad portion.

22. The method for manufacturing a touch-panel conductive sheet according to claim 17,
wherein the through holes are formed by drilling processing and laser processing.

* * * * *